US011424401B1

(12) United States Patent
Denis et al.

(10) Patent No.: US 11,424,401 B1
(45) Date of Patent: Aug. 23, 2022

(54) PHONONIC DEVICES AND METHODS OF MANUFACTURING THEREOF

(71) Applicant: United States of America as represented by the Administrator of NASA, Washington, DC (US)

(72) Inventors: Kevin Denis, Greenbelt, MD (US); Karwan Rostem, Baltimore, MD (US); Edward Wollack, Greenbelt, MD (US); Elissa Williams, Lanham, MD (US)

(73) Assignee: United States of America as represented by die Administrator of NASA

( * ) Notice: Subject to any disclaimer, the term of this patent is extended or adjusted under 35 U.S.C. 154(b) by 488 days.

(21) Appl. No.: 16/585,496

(22) Filed: Sep. 27, 2019

Related U.S. Application Data

(60) Provisional application No. 62/834,572, filed on Apr. 16, 2019.

(51) Int. Cl.

| | |
|---|---|
| ***H01L 39/00*** | (2006.01) |
| ***H01L 39/24*** | (2006.01) |
| ***H03H 9/02*** | (2006.01) |
| ***H01L 39/22*** | (2006.01) |
| ***H01L 39/08*** | (2006.01) |

(52) U.S. Cl.
CPC .......... *H01L 39/2406* (2013.01); *H01L 39/08* (2013.01); *H01L 39/22* (2013.01); *H03H 9/02102* (2013.01)

(58) Field of Classification Search
CPC ..... H01L 39/2406; H01L 39/08; H01L 39/22; H03H 9/02102
See application file for complete search history.

(56) References Cited

U.S. PATENT DOCUMENTS

| | | | | |
|---|---|---|---|---|
| 10,663,350 | B1 * | 5/2020 | Wollack | G01J 5/046 |
| 10,989,604 | B1 * | 4/2021 | Denis | G01J 5/20 |

* cited by examiner

*Primary Examiner* — Matthew L Reames

(74) *Attorney, Agent, or Firm* — Heather Goo; Bryan A. Geurts; Helen M. Gaius

(57) ABSTRACT

The present invention relates to a plurality of phononic devices and a method of manufacturing thereof. In one embodiment, highly sensitive superconducting cryogenic detectors integrate phononic crystals into their architecture. The phononic structures are designed to reduce the loss of athermal phonons, resulting in lower noise and higher sensitivity detectors. This fabrication process increases the qp generation recombination rate, thus, reducing the noise equivalent power (NEP) without sacrificing the scalability. A plurality of phononic devices, such as a kinetic inductance detector (KID), a transition edge sensor (TES) bolometer, and quarterwave backshort, can be manufactured according to the methods of the present invention.

31 Claims, 6 Drawing Sheets

105 108 106 103 103 105 103 102 101 107

PHONONIC DEVICES AND METHODS OF MANUFACTURING THEREOF

CROSS-REFERENCE TO RELATED APPLICATIONS

The present application claims priority from U.S. Provisional Patent Application No. 62/834,572, filed Apr. 16, 2019, the contents of which are herein incorporated by reference in their entirety. The present invention is related to co-pending U.S. Patent Application entitled "Phononic-Isolated Kinetic Inductance Detector and Fabrication Method Thereof", filed Sep/ 27, 2019, U.S. patent application Ser. No. 16/585,559, and co-pending U.S. Patent Application entitled "Cryogenic Detector with Integrated Backshort and Method of Manufacturing Thereof", filed Sep. 27, 2019, U.S. patent application Ser. No. 16/585,509, the contents of which are herein incorporated by reference in their entirety.

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to a plurality of phononic devices and a method of manufacturing thereof. In one embodiment, highly sensitive superconducting cryogenic detectors integrate phononic crystals into their architecture. The phononic structures are designed to reduce the loss of recombination and athermal phonons, resulting in lower noise and higher sensitivity detectors. A plurality of phononic devices, such as a kinetic inductance detector (KID) and transition edge sensor (TES) can be manufactured according to the methods of the present invention.

2. Description of the Related Art

Kinetic inductance detectors (KIDs) are highly scalable to large format arrays but are not as sensitive as transition edge sensor (TES) bolometers, and have not demonstrated noise equivalent power (NEP) less than $10^{-19}$ W/rt-Hz, and are limited by the generation recombination rate of quasi-particles (qp) in the superconducting film.

Phononic devices such as KIDs and TESs can be isolated and where, as in KIDs, the qp generation recombination rate can be reduced, the noise equivalent power (NEP) can be reduced without sacrificing the scalability.

Further, a "backshort", which is a resonantly tuned reflective termination (i.e., typically a low loss metallic layer), is used to achieve near unity coupling of radiation to the absorber structure. To achieve high coupling efficiency the structure should be metallized and be positioned at a controlled electrical delay spacing (e.g., one-quarter wavelength, three-quarter wavelength, etc.) for maximizing the coupling of the absorptive elements of the sensor structure. As such—the termination can be realized by micromachining silicon, however, from an electromagnetic perspective the "backshort" is realized from a highly reflective media (i.e., a metal, a stack of high/low-contrast dielectrics, other). The silicon is used to define the geometry—the metal provides the desired impedance contrast to realize a standing wave with a maxima positioned at the location in the sensor where the absorptive media exists.

Thus, a "silicon backshort" which can be utilized with the TES-based or KID superconducting detectors, is also desired.

SUMMARY OF THE INVENTION

The present invention relates to a plurality of phononic devices and a method of manufacturing thereof. In one embodiment, highly sensitive superconducting cryogenic detectors integrate phononic crystals into their architecture. The phononic structures are designed to reduce the loss of athermal phonons from the superconductor, resulting in lower noise and higher sensitivity detectors. This fabrication process increases the qp generation recombination lifetime, thus, reducing the noise equivalent power (NEP) without sacrificing the scalability. A plurality of phononic devices, such as a kinetic inductance detector and TES detector can be manufactured according to the methods of the present invention.

It is anticipated that a photon noise limited sub-mm/far-IR cold telescope in space will require detectors with noise equivalent power (NEP) less than $1\times10^{-19}$ W/Hz$^{1/2}$ for imaging applications and at least an order of magnitude lower for spectroscopic studies. The detector NEP can be reduced by lowering the operation temperature and improving the thermal isolation between the bolometer and a heat bath. Thus, a TES can be isolated by a phononic crystal, reducing the thermal conduction to the thermal bath and reducing the NEP. The present invention achieved this by fabricating a membrane isolated transition edge sensor bolometer incorporating compact (<50 μm) thermal isolation beams based on phononic filters.

Since phonons can propagate coherently through a solid medium, such as a dielectric membrane or beam, at temperatures below ~200 mK, the inventors of the present invention utilized this attribute to design structures such that there is a phononic bandgap that blocks modes of heat flow through the beams.

In the present invention, multistage filters are incorporated with tuned bandgaps that are analogous to poles in an electronic filter. A stop-band provides high rejection of heat flow in a compact geometry.

In the present invention, a variety of phononic device geometries have been fabricated including two dimensional (2D) meshes as well as one dimensional (1D) structures articulated by bends and T-shaped features. In the present invention, transition edge sensor (TES) devices were fabricated on a beam-isolated 110 um×140 um membrane.

More specifically, phononic filters were created by etching quasi-periodic nanoscale structures into supporting thermo-mechanical beams. The cross-sectional dimensions of the etched features are less than the thermal wavelength at the operating temperature, enabling coherent phonon transport to take place in one dimension. The phonon stop-band can be tuned by adjusting the scale of the quasi-periodic structures. Cascading multiple filter stages can increase bandwidth and provide improved thermal (phononic) isolation similar to the function of a multistage electrical filter.

Since phonons can propagate coherently through a solid medium at temperatures below ~200 mK, the inventors of the present invention utilized this attribute to design structures such that there is a phononic bandgap that blocks modes of heat flow through the beams. In particular, when quasiparticles in a Bardeen-Cooper-Schrieffer (BCS) superconductor recombine into Cooper pairs, phonons are emitted within a narrow band of energies above the pairing energy at 2A. The present inventors discovered that a phonon bandgap restricting the escape of recombination phonons from a superconductor can increase the quasiparticle recombination lifetime by more than an order of magnitude. A phonon bandgap can be realized and matched to the recombination energy with a phononic crystal—i.e., a periodically patterned membrane.

The inventors have found that a phonon bandgap restricting the escape rate of recombination phonons from a superconducting film has a strong effect on the quasiparticle dynamics, improving the responsivity and lowering the noise in a kinetic inductance detector (KID). In the present invention, the quasiparticle lifetime $\tau_{qp}$ is increased by more than an order of magnitude for realistic bandgap properties that can be achieved with phononic crystals. When the pair-breaking photon rate is low, the enhancement in the quasiparticle lifetime calculated using non-equilibrium particle distributions is in good quantitative agreement with an equilibrium formulation. The enhancement in $\tau_{qp}$ has a significant impact in superconducting devices where quasiparticle fluctuation plays an important role in limiting the sensitivity and responsivity to pair-breaking photons. In addition, $\tau_{qp}$ is sensitive to the position of the phonon bandgap. This response provides a useful probe for phonon coupling in low-dimensional thin films. By symmetry of the phonon transport across a phononic crystal (PnC), an isolated superconductor of the present invention will be less susceptible to pair-breaking phonon-mediated quasiparticle poisoning.

The present invention can be achieved by two fabrication processes. The first fabrication process is as follows. First, in one embodiment, a silicon wafer is coated with a thin film bilayer of silicon oxide and silicon nitride (or amorphous silicon, poly-silicon, single crystalline silicon, nanocrystalline diamond, aluminum oxide or other material) and used as the starting wafer. The silicon or silicon nitride thin film acts as the structural material and its thickness is chosen based on the desired phononic crystal properties. The oxide layer thickness is chosen to provide enough material to serve as an etch stop, typically on order of 300-500 nm. In one embodiment, the dielectric support layer thickness of 300 nm is chosen.

In one embodiment, the phononic crystal is then patterned with holes using electron beam lithography to obtain minimum features on the order of 50 nm. In one embodiment, the structures are then etched in a plasma chemistry compatible with the material, such as fluorine for silicon or silicon nitride, or chlorine for aluminum oxide ($Al_2O_2$), or oxygen for a diamond-based material, in which case, a hard metal mask patterned with electron beam lithography resist would be used. The etching process stops on the silicon oxide ($SiO_x$) layer.

Next, in one embodiment, a niobium or other superconductor layer is deposited, patterned and etched. In one embodiment, this can be done in a liftoff process so as not to damage the SiN or Si layer.

In one embodiment, a superconducting material with a tuned transition temperature set to the operating point of the device is deposited then etched or lifted-off. Bilayer materials such as molybdenum-gold (MoAu), titanium gold (TiAu), molybdenum copper (MoCu), or single layers such as iridium (Ir), tungsten (W), hafnium (Hf), or alloys such as molybdenum niobium (MoNb), aluminum manganese (AlMn), or other materials can be used. Outside of the detector area, heat sinking materials such as gold are used to provide a stable thermal bath for the detector. In the embodiment of a TES bolometer, a metal such as Au, platinum (Pt) or palladium (Pd), with a large density of electron states is also formed on the pixel membrane thermally coupled to the TES to set a thermal time constant of the bolometer.

In one embodiment, a temporary bond is made of the device wafer to a handle wafer of Pyrex, with a temporary bonding material such as wax or polymer. In one embodiment, the silicon handle wafer is then patterned and etched using deep reactive ion etching which stops on the silicon oxide. In one embodiment, the silicon oxide is etched in hydrofluoric acid. In one embodiment, the wax bonding material is then dissolved with the final structure removed from the temporary handle wafer, completing the fabrication process.

The first fabrication process of the present invention is beneficial in that it is simple aside from the incorporation of the nanostructured membranes. In summary, the first fabrication process' novelty is an implementation of incorporation of a phononic crystal into a KID architecture.

The second fabrication process of the present invention also has desirable benefits. In one embodiment, the second manufacturing process incorporates a second dielectric material such as a nanocrystalline diamond that can be used as a stiffening material for the phononic crystal. In one embodiment, the second method may not require a phononic crystal with holes going completely through the final membrane—potentially improving the mechanical integrity of the resulting structures. Further, in one embodiment, because the phononic crystal is on the opposite side of the superconducting wiring, it can completely cover the membrane supporting the detector, potentially improving the performance.

In one embodiment, the second fabrication process starts with the same silicon on insulator wafer or silicon wafer coated with a thin film bilayer of silicon oxide and silicon nitride (or a-Si:H or polysilicon or single crystalline silicon or $Al_2O_3$ or other material). In one embodiment, a thin layer of nanocrystalline diamond is deposited and patterned and etched by electron beam lithography and oxygen plasma, respectively. In one embodiment, a hard mask such as aluminum, nickel, chrome or other material may be required for this step.

In one embodiment, a nanocrystalline diamond (rather than diamond-like carbon) material is desirable because it is compatible with subsequent fabrication processes and is a very stiff material with a very high Young's modulus similar to bulk diamond. In one embodiment, the diamond phononic crystal is coated with a thin layer of silicon oxide. In one embodiment, the wafer is then bonded with a polymer to a new silicon handle wafer. In one embodiment, the original silicon wafer is lapped and etched off and the first silicon oxide is removed in hydrofluoric acid solution exposing the thin film Si (or SiN or a-Si:H). In one embodiment of the present invention, the next fabrication processes proceed as in the first fabrication version—i.e., the niobium and hafnium are deposited, patterned and etched. The wafer is bonded to the temporary Pyrex wafer with wax and the silicon handle wafer is etched with a deep reactive ion-ion etcher (DRIE) to the polymer bonding material. In one embodiment, the polymer bonding material is removed with oxygen plasma with the silicon oxide ($SiO_x$) protecting the thin diamond film. In one embodiment, the $SiO_x$ is then removed in hydrofluoric acid. Finally, in one embodiment, the wax is dissolved and the membrane and chip is freed from the handle wafer completing the process.

In the embodiment of the second fabrication process, the process is a novel implementation which has added benefits. In particular, the process incorporates a second dielectric material such as a nanocrystalline diamond that can be used as a stiffening material for the phononic crystal. The integration of a nanocrystalline diamond (NCD) into the sacrificial silicon process of the second implementation, is novel over the prior art. Further, the embodiment of the second method does not require the phononic crystal to have holes going completely through the final membrane, potentially improving the mechanical integrity of the resulting structures. Further, because the phononic crystal is on the opposite side of the superconducting wiring, the phononic structures can completely cover the membrane potentially improving the performance.

In a third embodiment of the present invention, a detector is fabricated using a silicon wafer bonded using a remote plasma process with a silicon oxide ($SiO_x$) layer, which forms a bilayer with a thin film of another material, such as a silicon nitride (SiN) (or amorphous silicon) or diamond material. A thin layer of titanium and gold is deposited, and niobium (Nb) leads are defined as well as the gold contact pads.

In one embodiment, the wafer is then patterned for electron beam lithography of the phononic structures and etched in a capacitive coupled plasma reactive ion etcher (RIE). Minimum phononic structures are achieved with the present process, and aluminum manganese (AlMn) is deposited as the TES. In one embodiment, the wafer was then bonded to a Pyrex handle wafer with wax, and the backside of the silicon is patterned and etched with DRIE. Finally, in one embodiment, the wax is dissolved, and the chips are separated from the Pyrex wafer and dried.

In a final embodiment, a resonant backshort can be achieved by the addition of a silicon handle wafer with a gold layer which is bonded using a polymer to either the KID detector or TES bolometer achieved by the above fabrication processes. A stop layer to control delay spacing and the flatness of the reflective metal termination layer of the backshort may be necessary. In one embodiment, the resonant backshort tuning configuration of the present invention provides near unity detector coupling efficiency over a specified range of frequencies by providing an appropriate electrical delay (e.g., 1-quarterwave, 3-quarter-wave, etc.) between the TES absorber coating (i.e., thin film approximating the impedance of free space ($Z_0=377\Omega$)) and a reflective short (i.e., metallization layer (i.e., gold) with the surface impedance small compared to impedance of free space). In one embodiment, this coupling approach is of particular utility in low-background imaging and spectroscopy applications commonly encountered in the far-to-mid-infrared range.

The present invention would have benefits in any commercial application that requires very high-performance cryogenic detectors. The process could potentially enable single photon calorimetry in infrared (IR) applications.

In one embodiment, a method of fabricating a phononic device includes: providing a first silicon wafer; depositing a bilayer of structural material, the bilayer including a silicon oxide first layer and a second layer, the second layer which forms a phononic crystal disposed on the first silicon wafer; depositing a first superconductor layer on the bilayer; depositing a second superconductor layer on the bilayer to function as a kinetic inductance material; patterning and etching the first silicon wafer; and removing at least a portion of the first silicon wafer to achieve a membrane of the second layer to form the phononic device.

In one embodiment, the second layer of the bilayer includes a material including one of a single-crystalline silicon, a silicon nitride material, an amorphous or poly-silicon material, a nanocrystalline diamond, or an aluminum oxide material.

In one embodiment, the first superconductor layer includes niobium.

In one embodiment, the second superconductor layer includes a single layer including one of hafnium, tungsten, or iridium, or a bilayer alloy including one of aluminum manganese, molybdenum niobium, molybdenum copper, molybdenum gold, or titanium gold.

In one embodiment, prior to depositing the first superconductor layer, the method further includes: depositing a third layer of nanocrystalline diamond on the second layer to stiffen the phononic device; and etching the third layer to form gaps.

In one embodiment, the method further includes: coating the etched third layer of nanocrystalline diamond with a fourth layer of silicon oxide.

In one embodiment, after coating the third layer, and prior to depositing the first superconductor layer, the method further includes: depositing a polymer layer to the fourth layer of silicon oxide; bonding a second silicon wafer to the fourth layer using the polymer layer, thereby forming a layered wafer; and turning over the layered wafer and lapping and etching off the first silicon wafer and the first layer of silicon oxide to expose the second layer which supports the etched third layer of nanocrystalline diamond.

In one embodiment, the method further includes: removing a portion of the second silicon wafer and the fourth layer of silicon oxide and the polymer layer, to expose the etched third layer supported by the second layer.

In one embodiment, the method further includes: removing a portion of the first layer, in addition to removing at least the portion of the first silicon wafer.

In one embodiment, the method further includes: patterning and etching the second layer and stopping etch on the silicon oxide first layer, to obtain gaps in the membrane of the second layer and forming the phononic crystal.

In one embodiment, prior to removing the portion of the first layer, the method further includes: forming a temporary bond between the second layer and a temporary handle wafer and a temporary bonding material; and removing a portion of the second silicon wafer and before removing the portion of the first layer and the temporary bonding material.

In one embodiment, the method further includes: etching the first superconductor layer to form gaps, the etching which stops on the first layer of silicon oxide.

In one embodiment, the second layer is a single crystalline silicon, and the second superconductor layer is deposited on the second layer.

In one embodiment, the method further includes: depositing a gold layer on the second layer for heat sinking and forming a layered structure.

In one embodiment, the method further includes: depositing a layer of a polymer to a surface of a removable handle wafer; bonding the removable handle wafer to the layered structure using the layer of the polymer; etching the first silicon wafer and a portion of the first layer; removing the polymer layer and the removable handle wafer leaving a membrane with the gaps in the first superconductor layer.

In one embodiment, the method further includes: providing a second handle wafer having two posts, and a gold layer disposed on one side of the second handle wafer; and providing a bonding material on each of the two posts of the second handle wafer; wherein the gold layer is disposed on a side facing the etched second layer; and bonding the second handle wafer to the etched second layer to form a resonant backshort.

In one embodiment, a phononic device includes: a first silicon wafer; a bilayer of structural material disposed on the first silicon wafer, the bilayer including a silicon oxide first layer and a second layer, the second layer which forms a phononic crystal disposed on the first silicon wafer; a first superconductor layer disposed on the bilayer; and a second superconductor layer disposed on the bilayer to function as a kinetic inductance material; wherein at least a portion of the first silicon wafer is removed to achieve a membrane of the second layer to form the phononic device.

In one embodiment, the second layer of the bilayer includes a material including one of a single-crystalline silicon, a silicon nitride material, an amorphous or poly-silicon material, a nanocrystalline diamond, or an aluminum oxide material.

In one embodiment, the first superconductor layer includes niobium.

In one embodiment, the second superconductor layer includes a single layer including one of hafnium, tungsten, or iridium, or a bilayer alloy including one of aluminum manganese, molybdenum niobium, molybdenum copper, molybdenum gold, or titanium gold.

In one embodiment, the device further includes: a third layer of nanocrystalline diamond deposited on the second layer to stiffen the phononic device; wherein the third layer is etched to form gaps.

In one embodiment, a fourth layer of silicon oxide is disposed on the etched third layer of nanocrystalline diamond.

In one embodiment, the first silicon wafer and the first layer of silicon oxide are etched to expose the second layer.

In one embodiment, a portion of the second silicon wafer, the fourth layer of silicon oxide and the polymer layer, are removed to expose the etched third layer supported by the second layer.

In one embodiment, the portion of the first layer and at least the portion of the first silicon wafer are removed.

In one embodiment, the second layer is patterned and etched, stopping on the silicon oxide first layer, to obtain gaps in the membrane of the second layer, and forming the phononic crystal.

In one embodiment, the first superconductor layer is etched to form gaps, the etching which stops on the first layer of silicon oxide.

In one embodiment, the second layer is a single crystalline silicon, and the second superconductor layer is deposited on the second layer.

In one embodiment, a gold layer is deposited on the second layer for heat sinking.

In one embodiment, the portion of the first silicon wafer and the portion of the first layer are removed, leaving a membrane with gaps in the first superconductor layer.

In one embodiment, a resonant backshort, includes: a first silicon wafer; a bilayer of structural material disposed on the first silicon wafer, the bilayer including a silicon oxide first layer and a second layer, the second layer which forms a phononic crystal disposed on the first silicon wafer; a first superconductor layer disposed on the bilayer; and a second superconductor layer disposed on the bilayer to function as a kinetic inductance material; wherein at least a portion of the first silicon wafer and the first layer are removed; wherein the second layer is patterned and etched, stopping on the silicon oxide first layer, to obtain gaps in the membrane of the second layer and forming the phononic crystal; a handle wafer having two posts, and a gold layer disposed on one side of the handle wafer; wherein the gold layer is disposed on a side facing the etched second layer; and a bonding material on each of the two posts of the handle wafer which bonds to the etched second layer to form the resonant backshort.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

DESCRIPTION OF THE INVENTION

Figure 1A:
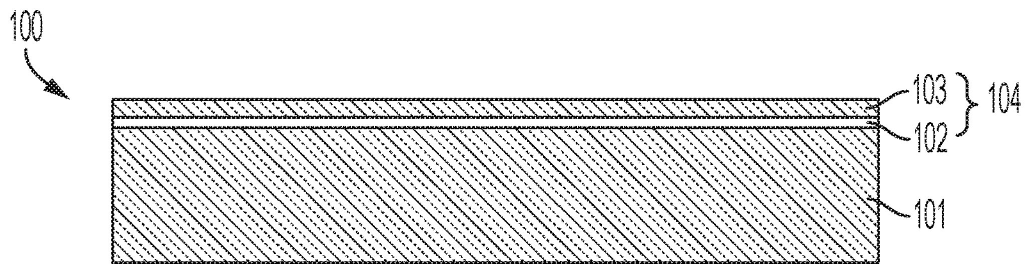
FIGS. 1A-1E depict a first fabrication process of a microwave kinetic inductance detector (KID) according to one embodiment consistent with the present invention.

The present invention relates to a plurality of phononic devices and a method of manufacturing thereof. In one embodiment, highly sensitive superconducting cryogenic detectors integrate phononic crystals into their architecture. The phononic structures are designed to reduce the loss of athermal phonons from the superconductor, resulting in lower noise and higher sensitivity detectors. This fabrication process increases the qp generation recombination lifetime, thus, reducing the noise equivalent power (NEP) without sacrificing the scalability. A plurality of phononic devices, such as a kinetic inductance detector (KID) or transition edge sensor (TES) can be manufactured according to the methods of the present invention. Additionally, a method for incorporating a resonant backshort is disclosed in the present invention.

It is anticipated that a photon noise limited sub-mm/far-IR cold telescope in space will require detectors with noise equivalent power (NEP) less than $1\times10^{-19}$ W/$Hz^{1/2}$ for imaging applications and at least an order of magnitude lower for spectroscopic studies. The detector NEP can be reduced by lowering the operation temperature and improving the thermal isolation between the bolometer and a heat bath. The present invention achieved this by fabricating a membrane isolated transition edge sensor bolometer incorporating compact (<50 pm) thermal isolation beams based on phononic filters.

Since phonons can propagate coherently through a solid medium, such as a dielectric membrane or beam, at temperatures below ~200 mK, the inventors of the present invention utilized this attribute to design structures such that there is a phononic bandgap that blocks modes of heat flow through the beams.

In the present invention, multistage filters are incorporated with tuned bandgaps that are analogous to poles in an electronic filter. A stop-band provides high rejection of heat flow in a compact geometry.

In the present invention, a variety of phononic device geometries have been fabricated including two dimensional (2D) meshes as well as one dimensional (1D) structures articulated by bends and T-shaped features. In the present invention, transition edge sensor (TES) devices were fabricated on a beam-isolated 110 um×140 um membrane.

More specifically, phononic filters were created by etching quasi-periodic nanoscale structures into supporting thermo-mechanical beams. The cross-sectional dimensions of the etched features are less than the thermal wavelength at the operating temperature, enabling coherent phonon transport to take place in one dimension. The phonon stop-band can be tuned by adjusting the scale of the quasi-periodic structures. Cascading multiple filter stages can increase bandwidth and provide improved thermal (phononic) isolation similar to the function of a multistage electrical filter.

Since phonons can propagate coherently through a solid medium at temperatures below ~200 mK, the inventors of the present invention utilized this attribute to design structures such that there is a phononic bandgap that blocks modes of heat flow through the beams. In particular, when quasiparticles in a Bardeen-Cooper-Schrieffer (BCS) superconductor recombine into Cooper pairs, phonons are emitted within a narrow band of energies above the pairing energy at 2A. The present inventors discovered that a phonon bandgap restricting the escape of recombination phonons from a superconductor can increase the quasiparticle recombination lifetime by more than an order of magnitude. A phonon bandgap can be realized and matched to the recombination energy with a phononic crystal—i.e., a periodically patterned membrane.

The present inventors discovered that a non-equilibrium quasiparticle and phonon distribution arises in a superconductor due to a phonon bandgap and a pair-breaking phonon signal. Although intrinsically a non-equilibrium effect, the present inventors found that the lifetime enhancement in the small-signal regime is remarkably similar to an estimate from an equilibrium formulation. The equilibrium estimate closely follows $\exp(\Omega_{bg}/k_B T_b)$, where $\Omega_{bg}$ is the phonon bandgap energy bandwidth above $2\Delta$ and $T_b$ is the phonon bath temperature of the coupled electron-phonon system. The inventors also found an impact of the phononic bandgap on the performance of a superconducting circuit element and designed a microwave resonator to measure the enhancement in the quasiparticle lifetime.

Thus, the inventors have found that a phonon bandgap restricting the escape rate of recombination phonons from a superconducting film has a strong effect on the quasiparticle dynamics, improving the responsivity and lowering the noise in a kinetic inductance detector (KID). In the present invention, the quasiparticle lifetime $\tau_{qp}$ is increased by more than an order of magnitude for realistic bandgap properties that can be achieved with phononic crystals. When the pair-breaking photon rate is low, the enhancement in the quasiparticle lifetime calculated using non-equilibrium particle distributions is in good quantitative agreement with an equilibrium formulation. The enhancement in $\tau_{qp}$ has a significant impact in superconducting devices where quasiparticle fluctuation plays an important role in limiting the sensitivity and responsivity to pair-breaking photons. In addition, $\tau_{qp}$ is sensitive to the position of the phonon bandgap. This response provides a useful probe for phonon coupling in low-dimensional thin films. By symmetry of the phonon transport across a phononic crystal (PnC), an isolated superconductor of the present invention will be less susceptible to pair-breaking phonon-mediated quasiparticle poisoning.

The present invention can be achieved by two fabrication processes. The first fabrication process is as follows. First, in one embodiment, a silicon wafer is coated with a thin film bilayer of silicon oxide and silicon nitride (or amorphous silicon, poly-silicon, single crystalline silicon, nanocrystalline diamond, aluminum oxide or other material) and used as the starting wafer. The silicon or silicon nitride thin film acts as the structural material and its thickness is chosen based on the desired phononic crystal properties. The oxide layer thickness is chosen to provide enough material to serve as an etch stop, typically on order of 300-500 nm. In one embodiment, the dielectric support layer thickness of 300 nm is chosen.

In one embodiment, the phononic crystal is then patterned with holes using electron beam lithography to obtain minimum features on the order of 50 nm. In one embodiment, the structures are then etched in a plasma chemistry compatible with the material, such as fluorine for silicon or silicon nitride, or chlorine for aluminum oxide ($Al_2O_2$), or oxygen for a diamond-based material, in which case, a hard metal mask patterned with electron beam lithography resist would be used. The etching process stops on the silicon oxide ($SiO_x$) layer.

Next, in one embodiment, a niobium or other superconductor layer is deposited, patterned and etched. In one embodiment, this can be done in a liftoff process so as not to damage the SiN or Si layer.

In one embodiment, a superconducting material with a tuned transition temperature set to the operating point of the device is deposited then etched or lifted-off. Bilayer materials such as molybdenum-gold (MoAu), titanium gold (TiAu), molybdenum copper (MoCu), or single layers such as iridium (Ir), tungsten (W), hafnium (Hf), or alloys such as molybdenum niobium (MoNb), aluminum manganese (AlMn), or other materials can be used. Outside of the detector area, heat sinking materials such as gold are used to provide a stable thermal bath for the detector. In the embodiment of a TES bolometer, a metal such as Au, platinum (Pt) or palladium (Pd), with a large density of electron states is also formed on the pixel membrane thermally coupled to the TES to set a thermal time constant of the bolometer.

In one embodiment, a temporary bond is made of the device wafer to a handle wafer of Pyrex, with a temporary bonding material such as wax or polymer. In one embodiment, the silicon handle wafer is then patterned and etched using deep reactive ion etching which stops on the silicon oxide. In one embodiment, the silicon oxide is etched in hydrofluoric acid. In one embodiment, the wax bonding material is then dissolved with the final structure removed from the temporary handle wafer, completing the fabrication process.

Based upon the above, the inventors were able to fabricate a plurality of phononic devices, including a phononic isolated kinetic inductance detector (KID) and transition edge sensor (TES) bolometer. A plurality of fabrication processes was found to be successful in achieving the required features of the present invention and are provided below. Note that common methods of performing fabrication steps, such as etching, patterning, etc., are not provided as they should be familiar to one of ordinary skill in the art of fabricating bolometers and KID detectors.

First (KID) Fabrication Process

In one embodiment, the first fabrication process for a phononic isolated KID follows the novel steps depicted in FIGS. 1A-1E.

In one embodiment, FIG. 1A shows a silicon-on-insulator (SOI) 100, where a silicon wafer 101 is coated with a silicon oxide ($SiO_x$) 102 layer and a single crystalline silicon 103 layer forming a bilayer 104.

Alternatively, materials such as silicon nitride (SiN), amorphous or poly-silicon, nanocrystalline diamond, aluminum oxide or other material can be used instead of single-crystalline silicon 103 disposed on a silicon oxide layer 102 and silicon wafer 101.

In one embodiment, silicon nitride is utilized as layer 103 and is grown by low-pressure chemical vapor deposition (LPCVD) as low stress ($<150$ MPa) and slightly tensile.

In one embodiment, the thickness of layer 103 (i.e., silicon nitride (SiN) or Si) is chosen based on the desired phononic crystal properties. The oxide layer 102 thickness is chosen to provide enough material to serve as an etch stop, typically on the order of 300-500 nm. In one embodiment, the dielectric support layer 102 is 300 nm.

Figure 1B:
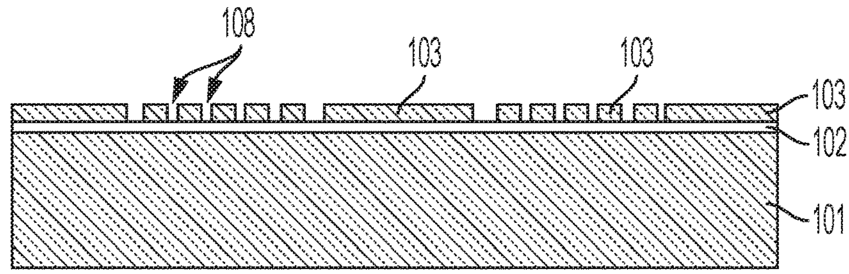

In one embodiment, as shown in FIG. 1B, the SiN (or Si) layer 103 is patterned, using electron beam lithography, and etched to obtain minimum features on the order of 50 nm. The layer 103 layer is etched in a plasma chemistry compatible with the material, such as fluorine for silicon or silicon nitride, or chlorine for aluminum oxide ($Al_2O_2$), or oxygen for a diamond-based material, and the etching stops on silicon oxide ($SiO_x$) layer 102.

Figure 1C:
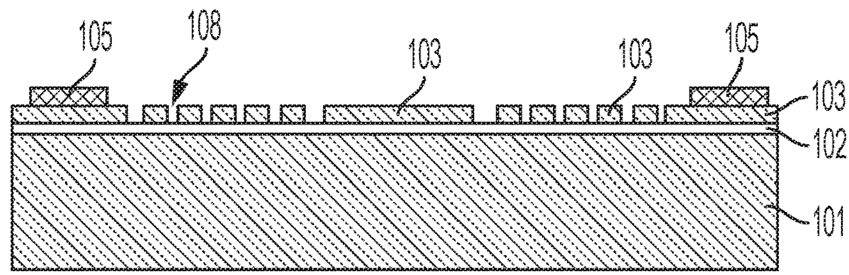

In one embodiment, as shown in FIG. 1C, a superconductor layer 105, such as a niobium (Nb) material or other superconductor material (e.g., niobium-titanium-nitride (NbTiN), niobium nitride (NbN), etc., with high kinetic inductance), is deposited on layer 103, patterned and etched. In one embodiment, this can be done in a liftoff process, using image reversal methods, so as not to damage layer 103 or the silicon oxide under-layer 102.

In one embodiment, the superconductor layer 105 (i.e., niobium) is deposited by DC sputter deposition. In one embodiment, the sputter deposition of the superconductor 105 was optimized to ensure a low stress (i.e., less than 100 MPa) to reduce potential bowing of the membrane and beams.

Figure 1D:
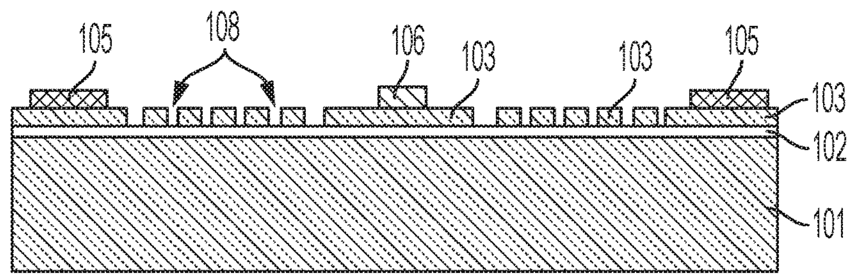

In one embodiment, as shown in FIG. 1D, another superconductor layer 106, such as hafnium (Hf) or other superconductor material, is deposited on layer 103, and patterned and etched to function as the kinetic inductance material.

In one embodiment, a thin noble metal such as gold (Au) is deposited sequentially with the niobium layer 105, then patterned and etched to improve electrical contact between the second superconductor layer 106 and first superconductor layer 105.

In one embodiment, a temporary bond is made between the device layer 103 to a transparent, temporary handle wafer of Pyrex or sapphire (not shown separately in FIG. 1E, but see FIG. 2D for example), with a temporary bonding material such as wax or polymer. The silicon handle wafer is then patterned and etched using deep reactive ion etching (DRIE).

Figure 1E:
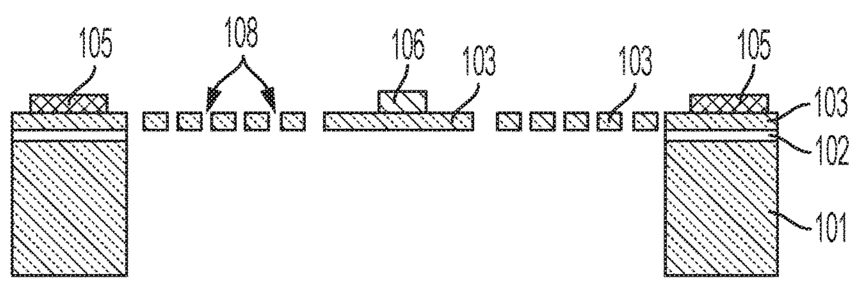

In one embodiment, the silicon oxide layer 102 is removed, and the wax bonding material then is dissolved with the final structure removed from the temporary handle wafer (see FIG. 1E).

In one embodiment, the above steps complete one embodiment of the fabrication process, creating a membrane which provides gaps 108 in and through layer 103, by removal of part of the silicon wafer 101 and silicon oxide layer 102.

Finally, in one embodiment, the chips 107, once separated from the Pyrex wafer, are dried in a carbon dioxide ($CO_2$) critical point dryer.

The embodiment of the first fabrication process of the present invention is advantageous in that it is simple aside from the incorporation of the nanostructured membranes. In summary, the first fabrication process' novelty is an implementation of incorporation of a phononic crystal into a KID architecture.

Second (KID) Fabrication Process

In another embodiment of the present invention, a second fabrication process (see FIGS. 2A-2H) incorporates a second dielectric material such as a nanocrystalline diamond that can be used as a stiffening material for the phononic crystal. The second method has the advantage that it may not require a phononic crystal with holes going completely through the final membrane, potentially improving the mechanical integrity of the resulting structures. Further, because the phononic crystal is on the opposite side of the superconducting wiring, it can completely cover the membrane supporting the detector, potentially improving the performance.

Figure 2A:
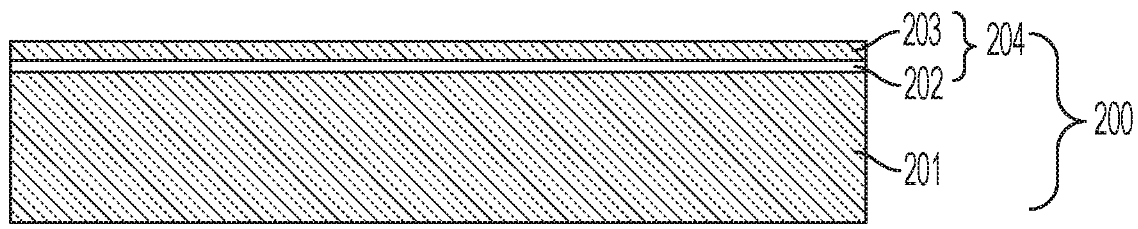
FIGS. 2A-2H depict a second fabrication process of a microwave kinetic inductance detector (KID) according to one embodiment consistent with the present invention.

In one embodiment, as shown in FIG. 2A, the second fabrication process starts with a silicon-on-insulator (SOI) 200 wafer, or more specifically, a silicon wafer 201 bonded using a remote plasma process with a thin layer of silicon oxide ($SiO_x$) 202 layer, which forms a bilayer 204 with a thin film of another material 203, such as a silicon nitride ($SiN_x$), or amorphous Si, or $Al_2O_3$, or poly-silicon, or nanocrystalline diamond, or other material. As with the first fabrication process, in one embodiment, layer 203 thickness is chosen based on the desired phononic crystal properties.

Figure 2B:
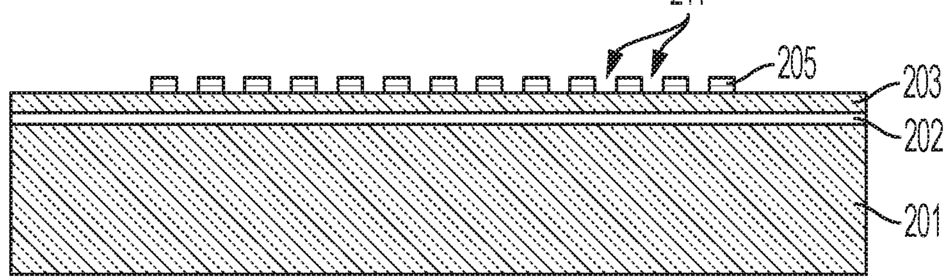

In one embodiment, as shown in FIG. 2B, a thin layer of nanocrystalline diamond 205 is deposited on layer 203 and patterned and etched by electron beam lithography and oxygen plasma leaving gaps 211.

In one embodiment, a hard mask such as aluminum, nickel, chrome or other material may be required for this step. A nanocrystalline diamond (rather than diamond-like carbon) material is desirable because it is compatible with subsequent fabrication processes and is a very stiff material with a very high Young's modulus similar to bulk diamond.

Figure 2C:
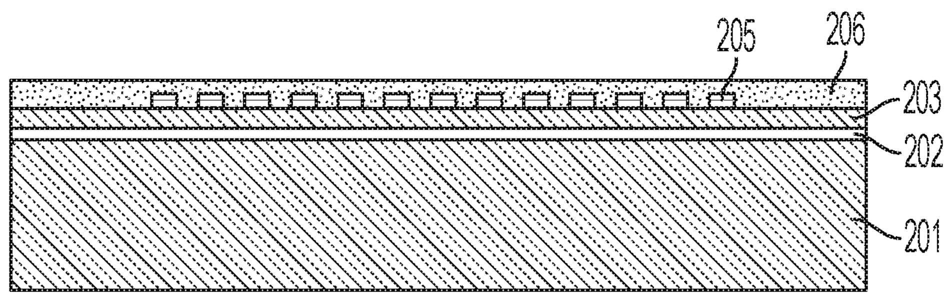

In one embodiment, as shown in FIG. 2C, the diamond layer 205 is coated with a thin layer of silicon oxide 206.

Figure 2D:
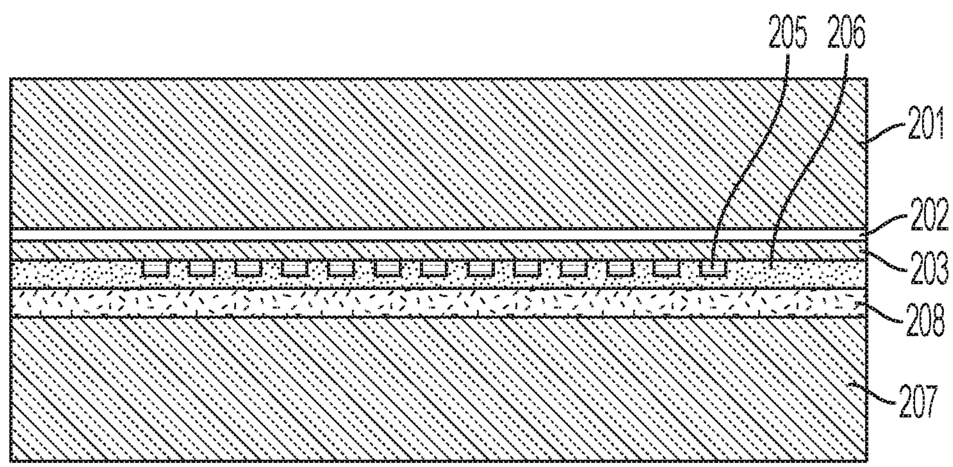

In one embodiment, as shown in FIG. 2D, the layered wafer 201-206 is then bonded with a polymer 208 to a new silicon handle wafer 207 (i.e., the layered wafer is flipped over and its silicon oxide layer 206 is bonded with polymer 208 to silicon wafer 207).

Figure 2E:
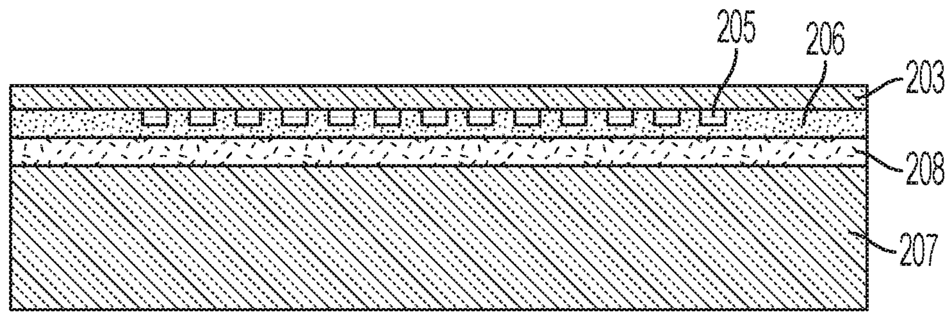

In one embodiment, the original silicon wafer 201 is lapped and etched off and the first silicon oxide layer 202 is removed in hydrofluoric acid solution exposing the thin film layer 203 (see FIG. 2E).

Figure 2F:
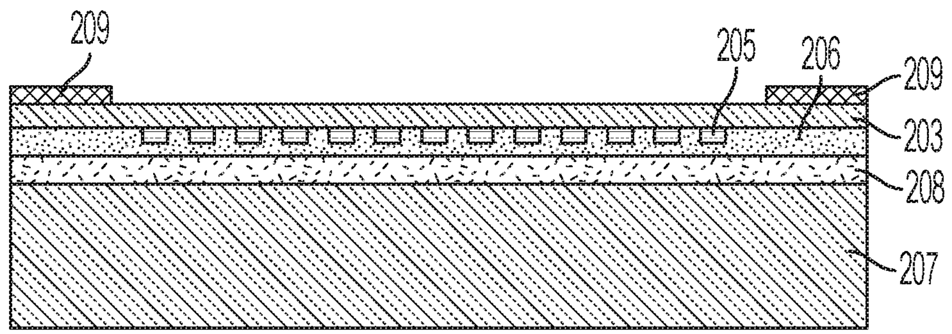
Figure 2G:
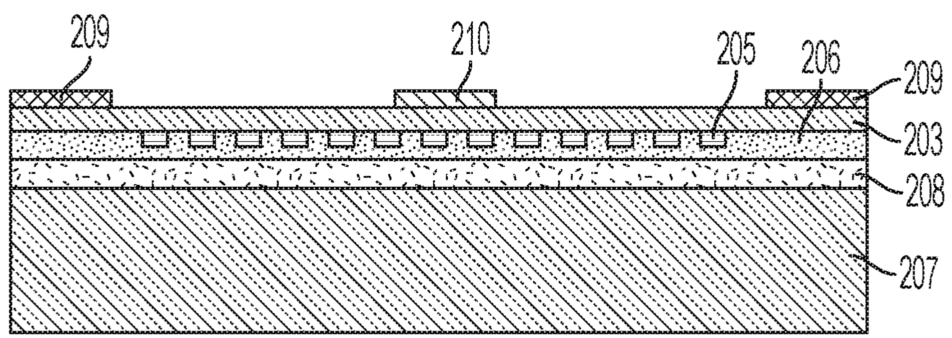

In one embodiment, as shown in FIGS. 2F-2G, the fabrication process proceeds as in the first fabrication method steps shown in FIGS. 1C and 1D. Namely, a superconductor layer 209, including a niobium material or other superconductor material, is deposited on layer 203, patterned and etched (FIG. 2F). Then, another superconductor layer 210, including hafnium or other superconductor material, is deposited on layer 203, and patterned and etched to function as the kinetic inductance material (FIG. 2G).

Figure 2H:
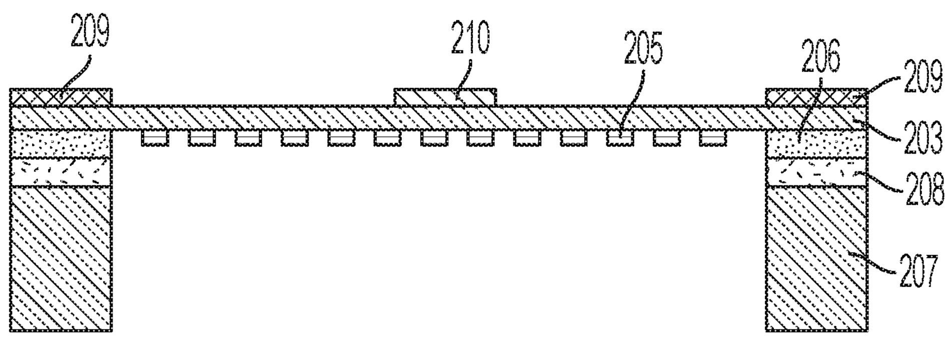

In one embodiment, in the step shown in FIG. 2H (similar to the step shown in FIGS. 1D-1E), the silicon handle wafer 207 is etched with a deep reactive ion etcher (DRIE) to the polymer bonding material 208. Then, the polymer bonding material 208 is removed with oxygen plasma with the silicon oxide ($SiO_x$) layer 206 protecting the thin diamond film 205. In one embodiment, the $SiO_x$ layer 206 is then removed in hydrofluoric acid. Thus, the stiffer membrane 203 hardened with the diamond film 205, remains, completing the process.

In the embodiment of the second fabrication process, the method concerned is a novel implementation which has added benefits. It incorporates a second dielectric material 205 such as nanocrystalline diamond that can be used as a stiffening material for the phononic crystal. The integration of a nanocrystalline diamond (NCD) into the sacrificial silicon process of the second implementation, is novel over the prior art. Further, the embodiment of the second method does not require the phononic crystal to have holes going completely through the final membrane, potentially improving the mechanical integrity of the resulting structures. Further, because the phononic crystal is on the opposite side of the superconducting wiring, the phononic structures can completely cover the membrane potentially improving the performance.

Third (Bolometer) Fabrication Process

In another embodiment, FIGS. 3A-3F show a silicon-on-isolator (SOI) 300, including a silicon wafer 301 bonded using a remote plasma process with a silicon oxide ($SiO_x$) 302 layer, which forms a bilayer with a thin film of single crystalline silicon 303. Alternatively, materials such as silicon nitride (SiN), amorphous silicon, poly-silicon, nanocrystalline diamond, aluminum oxide or other dielectric material can be used instead of single-crystalline silicon 303.

In one embodiment, the silicon oxide ($SiO_x$) 302 and SiN or Si 303 layer act as the structural material and layer 303 thickness is chosen based on the desired phononic crystal properties. The silicon oxide layer 302 thickness is chosen to provide enough material to serve as an etch stop, typically on order of 500 nm. In one embodiment, the dielectric support layer 302 has a thickness of 300 nm. In one embodiment, the silicon nitride 303 is grown by low-pressure chemical vapor deposition (LPCVD) as low stress (<150 MPa) and slightly tensile.

More details are provided below with respect to some of the manufacturing processes, which are similarly performed in the first and second fabrication processes.

In one embodiment, a superconductor layer 304, including a niobium (Nb) material or other superconductor material, are defined on the phononic crystal (see FIG. 3A), and gold (Au) contact pads are formed (not shown). In one embodiment, this step is done as a lift-off process, using image reversal methods, so as not to damage layer 303 or the silicon oxide under-layer 302.

In one embodiment, a noble metal, such as gold (10 nm) is deposited sequentially with the niobium (50 nm) layer 304 to improve electrical contact. In one embodiment, the gold is used to ensure that the superconductor layer 304 does not oxidize during the subsequent process steps and makes good electrical contact to subsequent superconductor layer 305.

In one embodiment, the layered silicon wafer 301 is then patterned with positive photoresist, for electron beam lithography of the phononic structures 304/303, which protects the gold (Au) in the areas of wire-bond pads and where the superconductor layer 304 (e.g., Nb) makes contact with the transition edge sensor. In one embodiment, after patterning, the layered wafer 301 is etched (see FIG. 3B), which terminates on the silicon oxide layer 302, forming gaps 310.

Figure 3A:
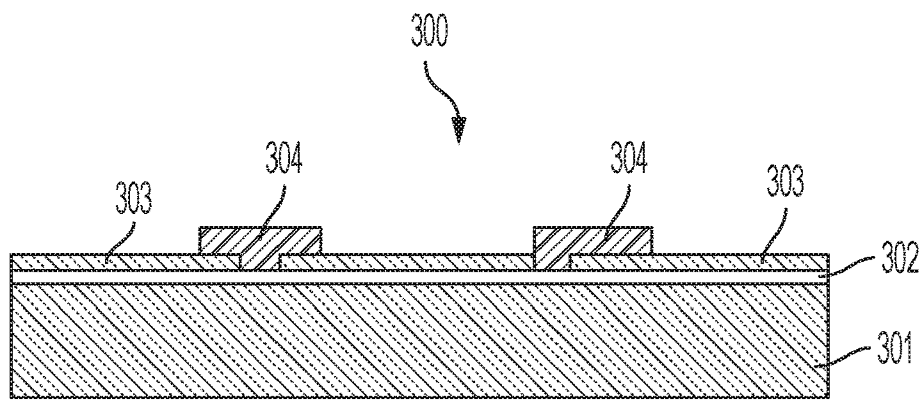
FIGS. 3A-3F depict a fabrication process of a bolometer according to one embodiment consistent with the present invention.
Figure 3B:
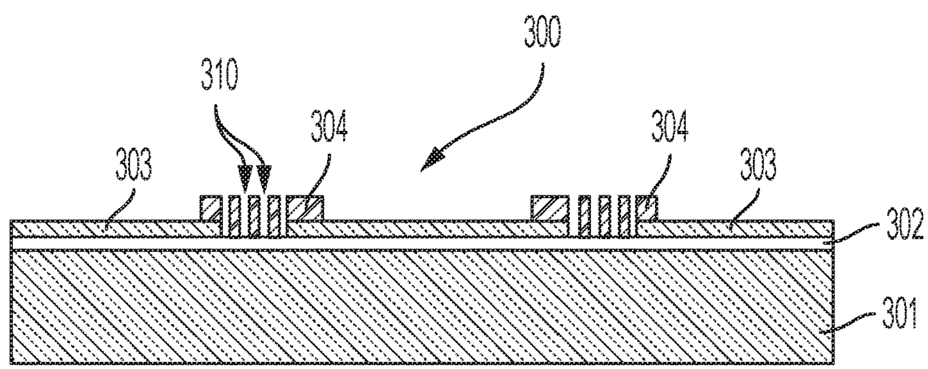
Figure 3C:
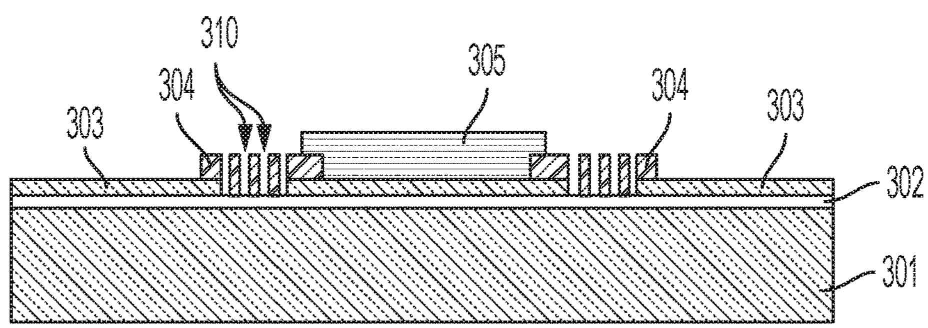

In one embodiment, as shown in FIG. 3C, another superconductor layer 305 is deposited as the transition edge sensor (TES), via a liftoff patterning step using resist, on those pixels that are TES-based. In one embodiment, the superconductor layer 305 is an alloy such as aluminum manganese (AlMn), but any superconducting material with a tuned transition temperature set to the operating point of the bolometer, can be used.

In one embodiment, bilayer materials such as molybdenum-gold (MoAu), titanium gold (TiAu), molybdenum copper (MoCu), or single layers such as iridium (Ir), tungsten (W), hafnium (H), or alloys such as molybdenum niobium (MoNb), aluminum manganese (AlMn), or other materials can be used as the superconductor material in layer 304. Outside of the detector area, heat sinking materials such as gold (Au) are used to provide a stable thermal bath for the detector. In the embodiment of a TES bolometer, a metal such as gold (Au), platinum (Pt) or palladium (Pd), with a large density of electron states is also formed on the pixel membrane thermally coupled to the TES to set a thermal time constant of the bolometer.

In one embodiment, the superconductor layers 304, 305 are deposited by DC sputter deposition, which is optimized for low stress (i.e., less than 100 MPa) to reduce potential of blowing of the membrane and beams.

Figure 3D:
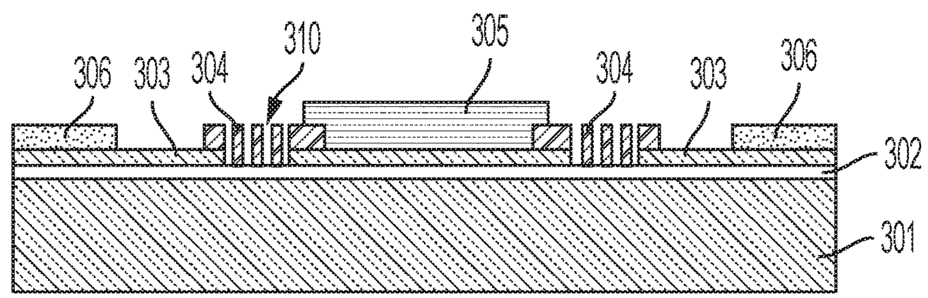

In one embodiment, a gold film 306 for chip heat sinking and TES detectors, is patterned from resist and electron beam deposited for lift-off (see FIG. 3D).

Figure 3E:
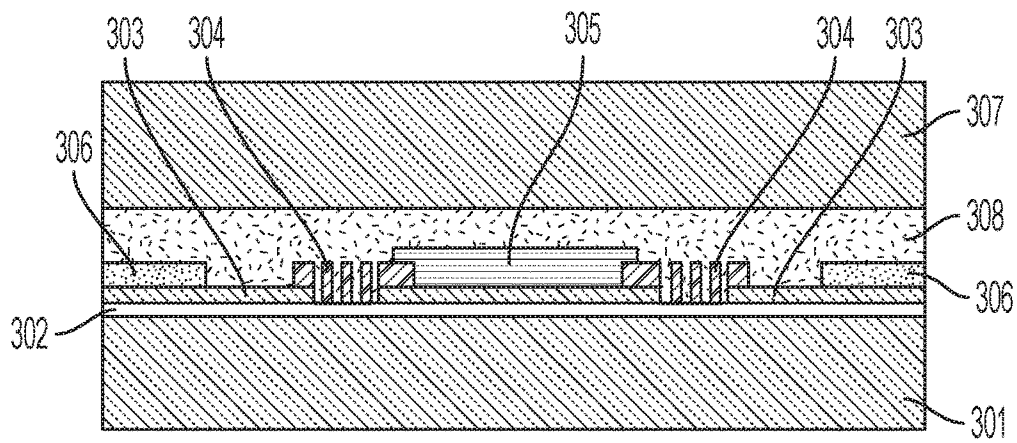
Figure 3F:
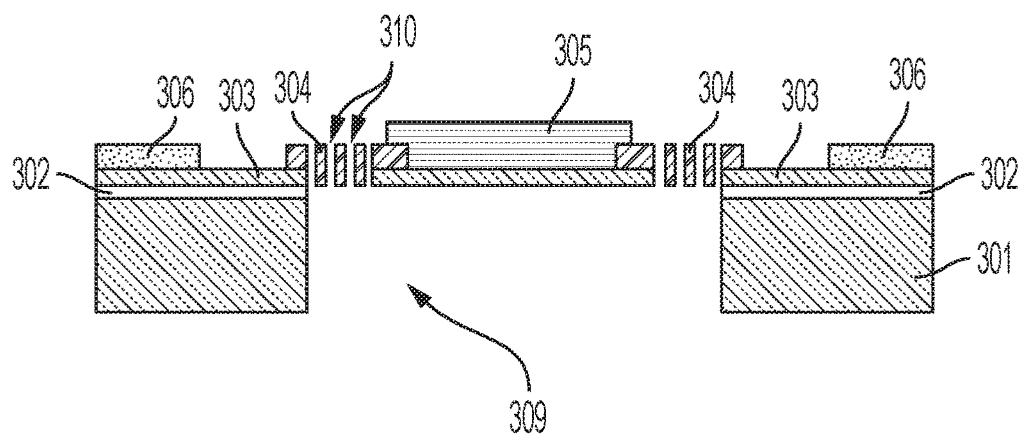

In one embodiment, the layered wafer 301 is then bonded to a transparent, removable handle wafer 307 of Pyrex or sapphire with a temporary bonding material such as wax or polymer 308 (see FIG. 3E).

In one embodiment, after wax bonding, the backside of the silicon wafer 301 is patterned (see FIG. 3F) with thick photoresist, and the 525 μm thick silicon wafer 301 is etched down to the buried silicon oxide 302 with a standard Bosch process including alternating $SF_6$ and $C_4F_8$ cycles (see FIG. 3F), leaving gaps 310 in the silicon or silicon nitride layer 303. In one embodiment, the silicon oxide 302 functions as an etch stop which is removed in HF solution after first using a surfactant.

In one embodiment, the wax or polymer 308 is dissolved in acetone and the chips 309 are separated and dried in a carbon dioxide ($CO_2$) critical point dryer.

In one embodiment, the phononic patterns and the membrane etch were done by electron beam lithography. To reduce the e-beam writing area and time, in one embodiment, these steps were achieved separately; the electron beam lithography was done in only the areas of the support beams and areas connecting the beams to the membrane were patterned using contact lithography.

In one embodiment, a similar process can be used with single crystal silicon via silicon-on-insulator wafers. In one embodiment, minimum phononic structures, sized on the order of 50 nm, are achieved with the present process. Depending on the geometry, final structures are typically offset from the mask by 15-20 nm, indicating minimal resist undercut.

In summary, the above fabrication processes of the present invention show that the present invention would be advantageous in any commercial application that requires very high-performance cryogenic detectors. Further, the processes of the present invention could potentially enable single photon calorimetry in ultraviolet (UV) to infrared (IR) applications.

Backshort Process

Figure 4:
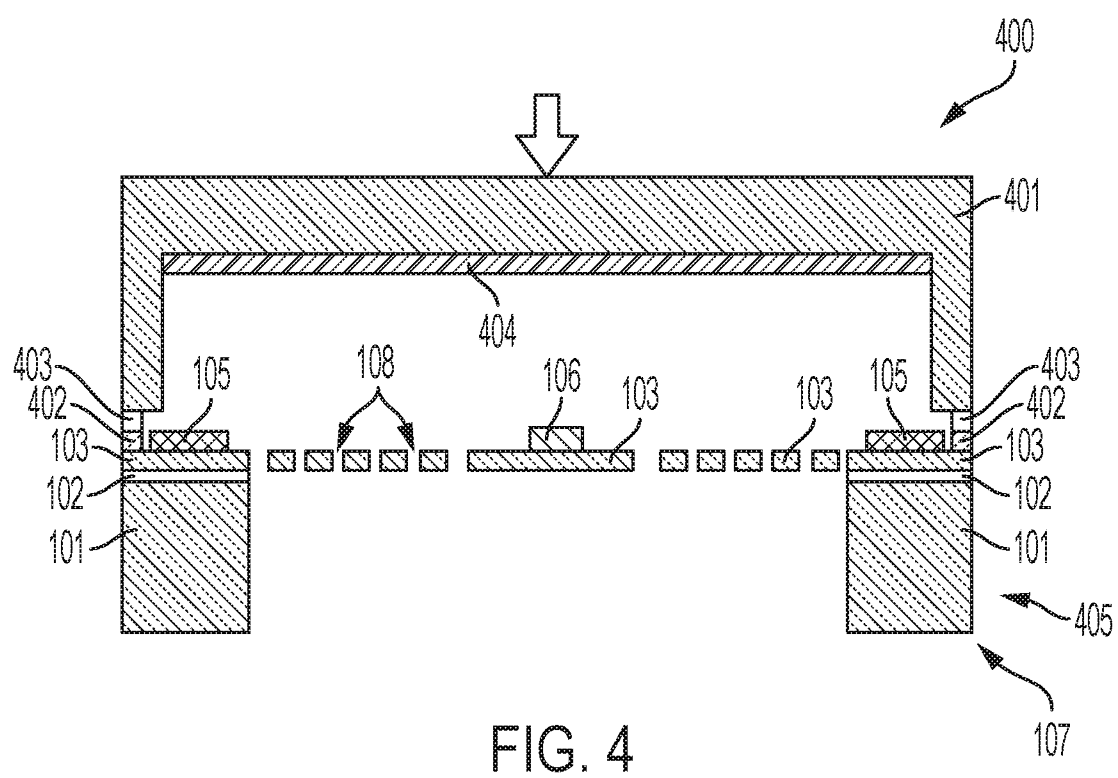
FIG. 4 depicts a backshort according to one embodiment consistent with the present invention.

In one embodiment, as shown in FIG. 4, a quarterwave backshort 400 can be achieved by the addition of a silicon handle wafer 401 with a gold layer 404, which is bonded using a polymer 402 to posts 403 of either the KID detector 405 or TES bolometer achieved by the above fabrication processes. A stop layer (not shown) to control delay spacing and the flatness of the reflective metal termination layer of the backshort may be necessary.

In one embodiment, the resonant backshort tuning configuration of the present invention provides near unity detector coupling efficiency over a specified range of frequencies by providing an appropriate electrical delay (e.g., 1-quarterwave, 3-quarterwave, etc.) between the TES absorber coating (i.e., thin film approximating the impedance of free space ($Z_0$=377Ω)) and a reflective short (i.e., metallization layer (i.e., gold) 404 with the surface impedance small compared to impedance of free space). In one embodiment, this coupling approach is of particular utility in low-background imaging and spectroscopy applications commonly encountered in the far-to-mid-infrared range.

As with the other fabrication processes embodied by the present invention, the fabrication of the backshorts uses deep reactive ion etching (DRIE) micro-machining techniques and gold-gold thermo-compression bonding at the wafer level.

The backshort assembly 400 of the present invention not only provides near-unity coupling efficiency but also mitigates coupling to out-band-radiation by the TES or other unshielded circuit elements and provides physical protection for the membrane structure on the sensor.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A method of fabricating a phononic device, the method comprising:

providing a first silicon wafer;

depositing a bilayer of structural material, said bilayer including a silicon oxide first layer and a second layer, said second layer which forms a phononic crystal disposed on said first silicon wafer;

depositing a first superconductor layer on said bilayer;

depositing a second superconductor layer on said bilayer to function as a kinetic inductance material;

patterning and etching said first silicon wafer; and removing at least a portion of said first silicon wafer to achieve a membrane of said second layer to form the phononic device.

2. The method of claim 1, wherein said second layer of said bilayer includes a material including one of a single-crystalline silicon, a silicon nitride material, an amorphous or poly-silicon material, a nanocrystalline diamond, or an aluminum oxide material.

3. The method of claim 2, wherein said first superconductor layer includes niobium.

4. The method of claim 3, wherein said second superconductor layer includes a single layer including one of hafnium, tungsten, or iridium, or a bilayer alloy including one of aluminum manganese, molybdenum niobium, molybdenum copper, molybdenum gold, or titanium gold.

5. The method of claim 4, wherein, prior to depositing said first superconductor layer, further comprising:

depositing a third layer of nanocrystalline diamond on said second layer to stiffen the phononic device; and etching said third layer to form gaps.

6. The method of claim 5, the method further comprising:

coating said etched third layer of nanocrystalline diamond with a fourth layer of silicon oxide.

7. The method of claim 6, wherein, after coating said third layer, and prior to depositing said first superconductor layer, the method further comprising:

depositing a polymer layer to said fourth layer of silicon oxide;

bonding a second silicon wafer to said fourth layer using said polymer layer, thereby forming a layered wafer; and turning over said layered wafer and lapping and etching off said first silicon wafer and said first layer of silicon oxide to expose said second layer which supports said etched third layer of nanocrystalline diamond.

8. The method of claim 7, the method further comprising:

removing a portion of said second silicon wafer, said fourth layer of silicon oxide, and said polymer layer, to expose said etched third layer supported by said second layer.

9. The method of claim 4, the method further comprising:

removing a portion of said first layer, in addition to removing at least said portion of said first silicon wafer.

10. The method of claim 9, the method further comprising:

patterning and etching said second layer, and stopping etch on said silicon oxide first layer, to obtain gaps in said membrane of said second layer and forming the phononic crystal.

11. The method of claim 10, wherein, prior to removing said portion of said first layer, the method further comprising:

forming a temporary bond between said second layer and a temporary handle wafer and a temporary bonding material; and removing said portion of the first silicon wafer before removing said portion of said first layer and said temporary bonding material.

12. The method of claim 9, the method further comprising:

etching said first superconductor layer to form gaps, said etching which stops on said first layer of silicon oxide.

13. The method of claim 12, wherein said second layer is a single crystalline silicon, and said second superconductor layer is deposited on said second layer.

14. The method of claim 13, the method further comprising:

depositing a gold layer on said second layer for heat sinking and forming a layered structure.

15. The method of claim 14, the method further comprising:

depositing a layer of a polymer to a surface of a removable handle wafer;

bonding said removable handle wafer to said layered structure using said layer of said polymer;

etching said first silicon wafer and a portion of said first layer;

removing said polymer layer and said removable handle wafer leaving a membrane with said gaps in said first superconductor layer.

16. The method of claim 11, the method further comprising:

providing a second handle wafer having two posts, and a gold layer disposed on one side of said second handle wafer; and providing a bonding material on each of said two posts of said second handle wafer;

wherein said gold layer is disposed on a side facing said etched second layer; and bonding said second handle wafer to said etched second layer to form a resonant backshort.

17. A phononic device, the device comprising:

a first silicon wafer;

a bilayer of structural material disposed on said first silicon wafer, said bilayer including a silicon oxide first layer and a second layer, said second layer which forms a phononic crystal disposed on said first silicon wafer;

a first superconductor layer disposed on said bilayer; and a second superconductor layer disposed on said bilayer to function as a kinetic inductance material, wherein at least a portion of said first silicon wafer is removed to achieve a membrane of said second layer to form the phononic device.

18. The device of claim 17, wherein said second layer of said bilayer includes a material including one of a single-crystalline silicon, a silicon nitride material, an amorphous or poly-silicon material, a nanocrystalline diamond, or an aluminum oxide material.

19. The device of claim 18, wherein said first superconductor layer includes niobium.

20. The device of claim 19, wherein said second superconductor layer includes a single layer including one of hafnium, tungsten, or iridium, or a bilayer alloy including one of aluminum manganese, molybdenum niobium, molybdenum copper, molybdenum gold, or titanium gold.

21. The device of claim 20, the device further comprising:

a third layer of nanocrystalline diamond deposited on said second layer to stiffen the phononic device;

wherein said third layer is etched to form gaps.

22. The device of claim 21, the device further comprising:

a fourth layer of silicon oxide disposed on said etched third layer of nanocrystalline diamond.

23. The device of claim 22, wherein said first silicon wafer and said first layer of silicon oxide are etched to expose said second layer.

24. The device of claim 23, wherein a portion of said second silicon wafer, said fourth layer of silicon oxide and said polymer layer, are removed to expose said etched third layer supported by said second layer.

25. The device of claim 20, wherein a portion of said first layer, and at least said portion of said first silicon wafer are removed.

26. The device of claim 25, wherein said second layer is patterned and etched, stopping on said silicon oxide first layer, to obtain gaps in said membrane of said second layer, and forming the phonic crystal.

27. The device of claim 23, wherein said first superconductor layer is etched to form gaps, said etching which stops on said first layer of silicon oxide.

28. The device of claim 27, wherein said second layer is a single crystalline silicon, and said second superconductor layer is deposited on said second layer.

29. The device of claim 28, the device further comprising:

a gold layer deposited on said second layer for heat sinking.

30. The device of claim 29, wherein said portion of said first silicon wafer and said portion of said first layer are removed, leaving a membrane with gaps in said first superconductor layer.

31. A resonant backshort, the backshort comprising:

a first silicon wafer;

a bilayer of structural material disposed on said first silicon wafer, said bilayer including a silicon oxide first layer and a second layer, said second layer which forms a phononic crystal disposed on said first silicon wafer;

a first superconductor layer disposed on said bilayer; and a second superconductor layer disposed on said bilayer to function as a kinetic inductance material, wherein at least a portion of said first silicon wafer and said first layer are removed;

wherein said second layer is patterned and etched, stopping on said silicon oxide first layer, to obtain gaps in said membrane of said second layer and forming the phononic crystal;

a handle wafer having two posts, and a gold layer disposed on one side of said handle wafer;

wherein said gold layer is disposed on a side facing said etched second layer; and a bonding material on each of said two posts of said handle wafer which bonds to said etched second layer to form the resonant backshort.

* * * * *